United States Patent [19]
Tomoeda et al.

[11] Patent Number: 5,759,614
[45] Date of Patent: *Jun. 2, 1998

[54] RESIST PROCESSING METHOD AND APPARATUS

[75] Inventors: Takayuki Tomoeda, Kumamoto-ken; Masaaki Murakami, Kumamoto; Kenichi Nishioka, Kumamoto-ken, all of Japan

[73] Assignees: Tokyo Electron Limited, Tokyo; Tokyo Electron Kyushu Limited, Tosu, both of Japan

[*] Notice: The term of this patent shall not extend beyond the expiration date of Pat. No. 5,626,913.

[21] Appl. No.: 639,748

[22] Filed: Apr. 29, 1996

Related U.S. Application Data

[62] Division of Ser. No. 400,935, Mar. 9, 1995, Pat. No. 5,626,913.

[30] Foreign Application Priority Data

Mar. 9, 1994 [JP] Japan .................................. 6-064345
Mar. 30, 1994 [JP] Japan .................................. 6-084064

[51] Int. Cl.$^6$ ........................................... B65D 3/12
[52] U.S. Cl. ................ 427/8; 427/240; 427/299; 427/336; 427/385.5; 427/420; 427/424
[58] Field of Search .................. 427/299, 240, 427/385.5, 420, 8, 336

[56] References Cited

U.S. PATENT DOCUMENTS

| | | | |
|---|---|---|---|
| 4,938,994 | 7/1990 | Choinski | 427/420 |
| 5,136,970 | 8/1992 | Saito et al. | 427/420 |
| 5,143,759 | 9/1992 | Saito et al. | 427/420 |

*Primary Examiner*—Janyce Bell
*Attorney, Agent, or Firm*—Oblon, Spivak, McClelland, Maier & Neustadt, P.C.

[57] ABSTRACT

The present invention provides a resist processing method for an object to be processed, including the processing step of supplying a process solution onto the object to be processed to perform a process on the object to be processed, and the cleaning step of supplying a cleaning solution onto the object to be processed to clean the object to be processed, wherein the processing step at least partially overlaps the cleaning step. The present invention also provides a resist processing method for an object to be processed, including the steps of positioning a process solution supply means for supplying a process solution above a quadrilateral object to be processed having a pair of opposing edges, moving the process solution supply means toward one edge of the pair of edges of the object to be processed relative to the object to be processed while supplying the process solution onto the object to be processed by the process solution supply means, and moving the process solution supply means from one edge of the object to be processed toward the other edge of the pair of edges of the object to be processed relative to the object to be processed while supplying the process solution onto the object to be processed by the process solution supply means.

14 Claims, 13 Drawing Sheets

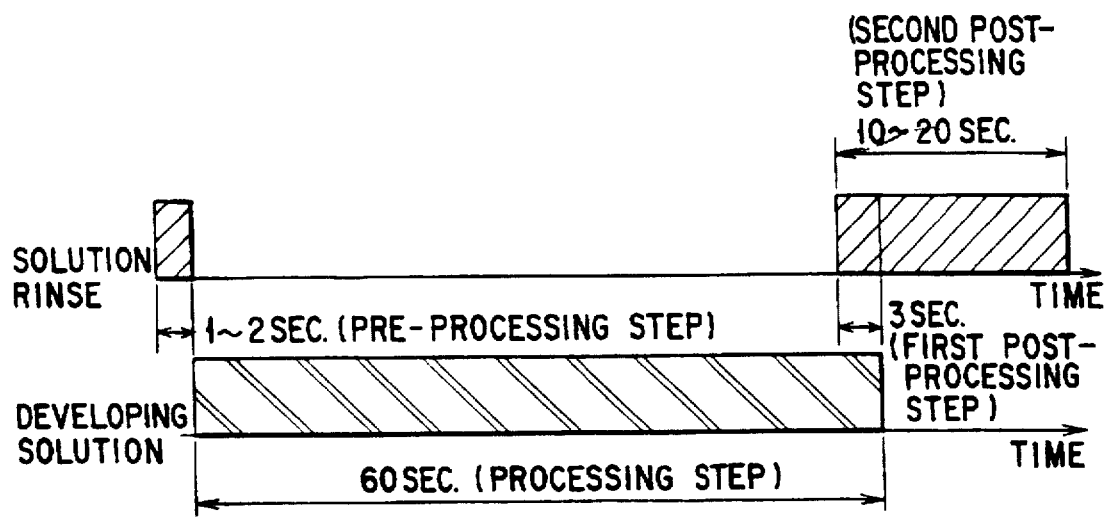
F I G. 4
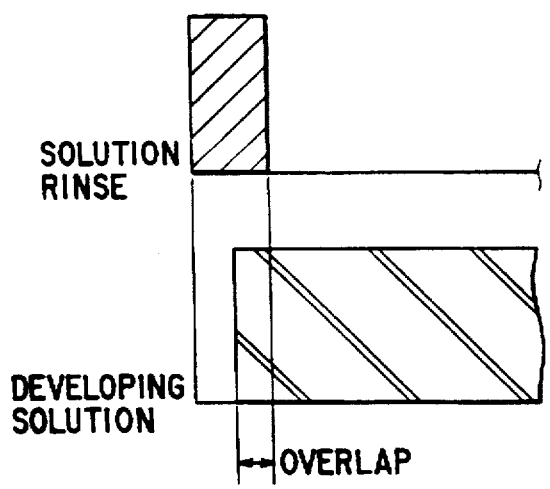 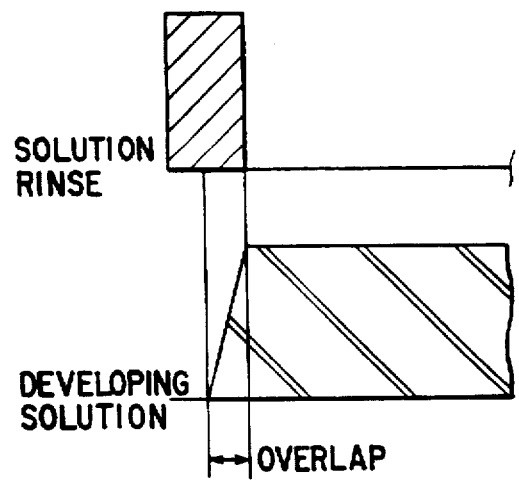
F I G. 5A    F I G. 5B

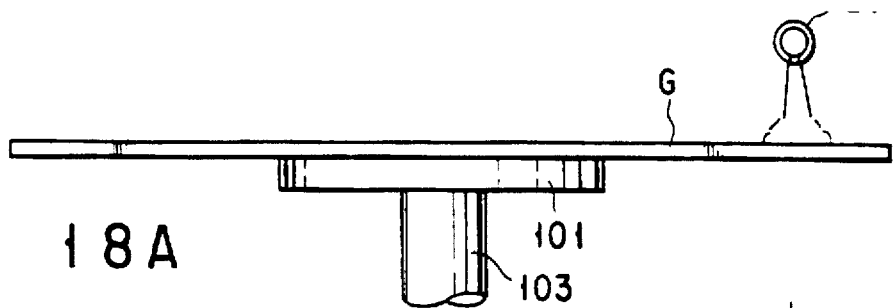
FIG. 18A
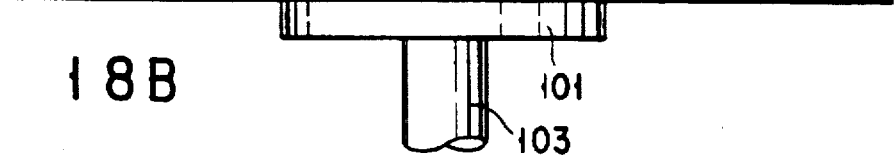
FIG. 18B
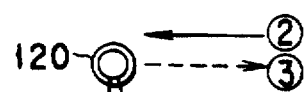
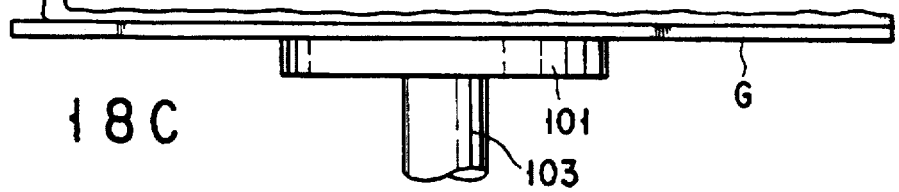
FIG. 18C
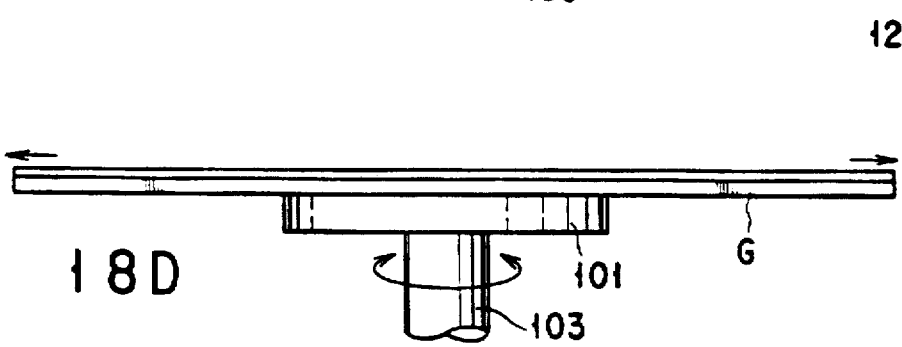
FIG. 18D
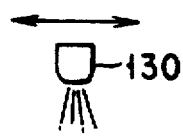
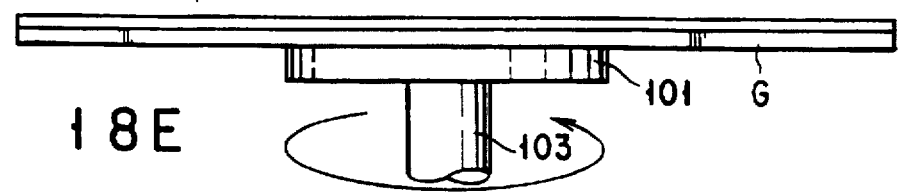
FIG. 18E

RESIST PROCESSING METHOD AND APPARATUS

This is a Division of application Ser. No. 08/400,935 filed on Mar. 9, 1995, now U.S. Pat. No. 5,626,913.

BACKGROUND OF THE INVENTION

1. Field of the Invention

The present invention relates to a method and apparatus for performing a resist process on an object to be processed such as a semiconductor wafer (to be referred to as a wafer hereinafter) or an LCD substrate.

2. Description of the Related Art

Generally, in the process of manufacturing a semiconductor device or a liquid crystal display element, a series of processes are performed as follows. That is, an object to be processed such as a wafer or an LCD substrate is arranged on a spin chuck capable of high-speed rotation, and a photoresist containing a photosensitive material is coated on the object to be processed while rotating the object to be processed at a high speed. A circuit pattern is transferred to the photoresist by using a photolithographic technique, and a developing process is performed on the resultant photoresist. In this developing process, a developing solution as a process solution is supplied onto the photoresist to which the circuit pattern is transferred. Thereafter, the developing solution is washed away, and a cleaning solution (rinse solution) for cleaning the surface of the wafer is supplied.

In the developing process, when the photoresist which is exposed and cannot be dissolved with respect to the developing solution contacts the developing solution, the photoresist swells (i.e., its volume increases). Then, when the swelling photoresist contacts the rinse solution, the developing solution is washed away, and the photoresist shrinks. Therefore, if the width of a circuit pattern transferred to the photoresist is small, a bridge is undesirably formed on the circuit pattern when the photoresist swells. Since the photoresist swells and shrinks, a stress is applied to the photoresist.

A polyimide-based resist, for example, has a relatively high viscosity. When the polyimide-based resist is used as an insulating interlayer, this resist is is formed to have a large film thickness of about 10 μm. In this case, the conventional developing method requires a long period of time for a developing process, resulting in a decrease in throughput. In order to solve this problem, it may be considered to increase the supply amount of a developing solution. Even if the supply amount of the developing solution is increased, the throughput does not increase so much, and the consumption amounts of the developing solution and a rinse solution are increased.

In the case of using a rectangular LCD substrate as an object to be processed, since the LCD substrate is relatively large, a developing solution supply nozzle (process solution supply means) for supplying a developing solution is arranged to be opposite to the LCD substrate so as to move the nozzle relative to the LCD substrate in the developing process. Since axial vibrations tend to occur during rotation of a spin chuck, the spin chuck is rotated by the rotating shaft of the spin chuck and a driving motor through a transmission means such as a belt or a chain. When a developing solution is to be supplied to the developing solution supply nozzle, a compressed nitrogen ($N_2$) gas, for example, is supplied into a developing solution tank connected to the developing solution supply nozzle through a developing solution supply pipe.

When the developing process is performed by using the resist processing apparatus having this arrangement, the developing solution supply nozzle is moved relative to the LCD substrate having the photoresist to which the circuit pattern is transferred, and the developing solution is supplied onto the photoresist in a film-like manner to perform development for a predetermined time. Thereafter, while rotating the spin chuck at a high speed, a rinse solution such as deionized water or distilled water is supplied onto the LCD substrate to wash away the developing solution.

In the above resist processing method, however, the developing solution supply nozzle is moved relative to the LCD substrate. For this reason, if positioning of the developing solution supply nozzle with respect to the LCD substrate is inaccurate, the developing solution is not coated on the end portion of the LCD substrate. A film of the developing solution formed on the photoresist becomes nonuniform, resulting in a decrease in yield. Since the axial vibrations occur during rotation of the spin chuck, a seal portion of the rotating shaft wears greatly, and this rotational vibrations may make the thickness of the film of the developing solution nonuniform, shortening the service life of the apparatus.

In addition, since the developing solution is supplied under pressure by the $N_2$ gas or the like to be supplied onto the LCD substrate, the $N_2$ gas is dissolved in the developing solution to form bubbles, and the bubbles are supplied onto the LCD substrate together with the developing solution. The bubbles undesirably cause development nonuniformity. Air may enter from apertures of the developing solution supply nozzle into the nozzle. In this case, the air entering into the nozzle also becomes bubbles, and the bubbles are also supplied onto the LCD substrate, causing the development nonuniformity.

SUMMARY OF THE INVENTION

It is an object of the present invention to provide a resist processing method for an object to be processed, which effectively utilizes process solutions such as a developing solution and a rinse solution to increase the throughput.

This object is achieved by a resist processing method for an object to be processed, as the first aspect, comprising: the processing step of supplying a process solution onto the object to be processed to perform a process on the object to be processed; and the cleaning step of supplying a cleaning solution onto the object to be processed to clean the object to be processed, wherein the processing step at least partially overlaps the cleaning step.

In the first aspect, when the processing step is to overlap the cleaning step, the cleaning solution may be supplied while the process solution is supplied onto the object to be processed. Alternatively, the process solution and the cleaning solution may be mixed in advance, and the solution mixture may be supplied to the object to be processed. The supply of the process solution may be instantaneously stopped, or gradually decreased to a predetermined amount. In addition, as for the supply of the process solution and the cleaning solution, the supply of the process solution may be gradually decreased, and the supply of the cleaning solution may be gradually increased.

The first aspect employs the first processing method. According to the first processing method, the cleaning solution is supplied onto the object to be processed to clean the object to be processed (pre-processing step). Then, the process solution is supplied onto the object to be processed to perform a process, and the process solution and the cleaning solution are mixed before the end of the process to supply the solution mixture onto the object to be processed (first post-processing step). Thereafter, the cleaning solution is supplied onto the object to be processed (second post-processing step). According to the first method, the cleaning solution is supplied before the process solution is supplied onto the object to be processed to which a circuit pattern is transferred. For this reason, a film of the cleaning solution is formed on the surface of the object to be processed, and this film promotes spread of the process solution. With this operation, a processing time can be shortened. By mixing and substituting the process solution and the cleaning solution, swell and shrinkage of the resist of the circuit pattern formed on the object to be processed can be relaxed.

Further, the first aspect employs the second processing method. According to the second processing method, the cleaning solution is supplied onto the object to be processed to clean the object to be processed. Then, the process solution is supplied onto the object to be processed to perform a process, and the process solution and the cleaning solution are mixed before the end of the process to supply the solution mixture onto the object to be processed (first post-processing step). Thereafter, the cleaning solution is supplied onto the object to be processed (second post-processing step). According to the second processing method, when the process is to be performed on the object to be processed, the supply of the cleaning solution overlaps the supply of the process solution. If the process solution is gradually increased to the predetermined amount within the overlapping time of the supply, the concentration of the process solution can be gradually increased, thereby relaxing an extreme change in solution. The process with respect to the object to be processed can be uniformed. With this operation, the yield can be increased.

It is another object of the present invention to provide a resist processing method and apparatus for an object to be processed by which a process solution such as a developing solution can be uniformly coated on the surface of the object to be processed to increase the yield.

This object is achieved by a resist processing method for an object to be processed, as the second aspect, comprising the steps of: positioning process solution supply means for supplying a process solution above a quadrilateral object to be processed having a pair of opposing edges; moving the process solution supply means toward one edge of the pair of edges of the object to be processed relative to the object to be processed while supplying the process solution onto the object to be processed by the process solution supply means; and moving the process solution supply means from one edge of the object to be processed toward the other edge of the pair of edges of the object to be processed relative to the object to be processed while supplying the process solution onto the object to be processed by the process solution supply means. According to the resist processing method of the second aspect, when the process solution supply means is to be moved with respect to the object to be processed, the process solution supply means is moved toward one edge of the object to be processed, and then moved toward the other edge. The process solution can be assuredly supplied to the edge portions of the object to be processed, thereby uniformly coating the process solution. With this operation, the yield can be increased.

In the resist processing method of the second aspect, it is preferable to rotate the object to be processed on which the process solution is coated while changing a rotational direction. The object to be processed is rotated clockwise and counterclockwise to scatter the process solution on the surface of the object to be processed outward. The process solution is brought into good contact with the object to be processed, thereby sufficiently coating the process solution. With this operation, the yield can be further increased.

The second aspect provides a resist processing apparatus, comprising: holding means for rotatably holding an object to be processed; process solution supply means for supplying a process solution onto a surface of the object to be processed; and cleaning solution supply means for supplying a cleaning solution onto the surface of the object to be processed, wherein the holding means is arranged in a vessel, and has a vacuum suction type spin chuck with a rotating shaft which can be elevated and rotated, and a seal mechanism is provided between the rotating shaft and the vessel, the seal mechanism being mainly constituted by a flexible seal member for closing a gap between the rotating shaft and the vessel, and a spring member for pressing the seal member against the rotating shaft and the vessel. With the resist processing apparatus having this arrangement, if axial vibrations occur during rotation of the spin chuck, the axial vibrations of the rotating shaft can be absorbed by the elasticity of the spring member. A gap between the rotating shaft and the vessel can be airtightly sealed without being affected by the size of the gap. Moreover, the spin chuck is easily set and maintained, and the service life of the apparatus can be prolonged. Furthermore, the object to be processed can be assuredly chucked by the spin chuck by suction to uniform coating of the process solution.

In the resist processing apparatus according to the second aspect, the process solution supply means is preferably constituted by a pipe-like process solution container having a length corresponding to the pair of edges of the object to be processed, and a plurality of apertures formed at a predetermined interval in a longitudinal direction of the process solution container, and a temperature adjustment mechanism is preferably provided at any position of a process solution supply pipe for connecting the process solution supply means and a process solution supply source near the process solution supply means. In the resist processing apparatus having this arrangement, the process solution to be supplied onto the object to be processed can be kept at a predetermined temperature, and the optimum processing conditions can be obtained, thereby increasing the throughput.

In the resist processing apparatus according to the second aspect, the process solution supply means preferably has a bubble drawing port formed in an upper portion of a process solution container, and a bubble discharge pipe in which a suction amount adjustment mechanism is preferably interposed is connected to the bubble drawing port. In the resist processing apparatus having this arrangement, bubbles can be removed from the process solution contained in the process solution supply means, thereby avoiding development nonuniformity caused by the bubbles with respect to the object to be processed.

In the present invention, the first and second aspects can be properly combined and used. Therefore, the throughput and yield can be further increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a timing chart of the resist processing method according to the first aspect;

FIGS. 5A, 5B, 6A, 6B and 6C are timing charts showing overlapped states of a processing step and a cleaning step of the resist processing method according to the first aspect;

FIGS. 18A, 18B, 18C, 18D and 18E are views for explaining the resist processing method according to the second aspect.

DETAILED DESCRIPTION OF THE PREFERRED EMBODIMENTS

Embodiments of the present invention will be described below in detail with reference to the accompanying drawings.

(Embodiment 1)

This embodiment will exemplify a case in which a resist processing method according to the first aspect of the present invention is applied to a wafer processing system.

Figure 1:
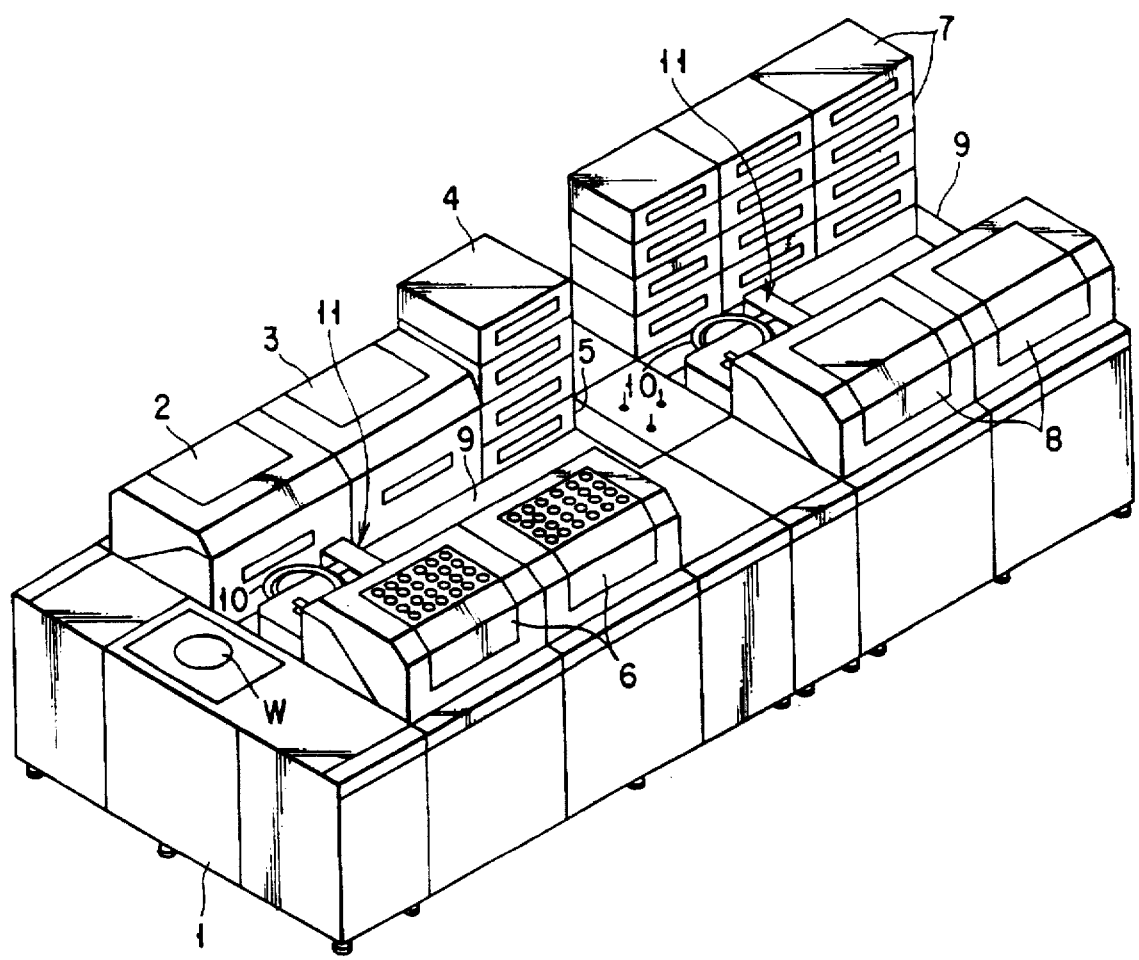
FIG. 1 is a perspective view showing a resist coating/developing system in which a resist processing apparatus used to practice a resist processing method according to the first embodiment of the present invention is incorporated.

As shown in FIG. 1, the wafer processing system is constituted by a loader section 1 in/from which a wafer W as an object to be processed is loaded/unloaded, a brush cleaning unit 2 for cleaning the wafer W by a brush, a jet water cleaning unit 3 for cleaning the wafer W by high-pressure jet water, an adhesion unit 4 for hydrophobically processing the surface of the wafer W, a cooling unit 5 for cooling the wafer W to a predetermined temperature by an electron refrigerating means such as a Peltier element utilizing a Peltier effect, resist coating units 6 each for coating a resist on the surface of the wafer W, and removing the excess resist from the peripheral edge portion of the wafer by a side rinse process, heating units 7 each for heating the wafer W before/after coating the resist to pre-bake/post-bake the wafer W, processing units (developing units) 8 each having a function of developing the exposed wafer W and rinsing the developed circuit pattern, and the like. These units are assembled to increase a working efficiency.

A wafer convey path 9 is provided at the central portion of the processing system having the above arrangement in the longitudinal direction. The wafer load/unload port of each of the units 2 to 8 is arranged to face the wafer convey path 9. A wafer convey arm 10 for transferring the wafer W among the units 2 to 8 is movably provided along the wafer convey path 9. A wafer convey mechanism 11 is constituted by the wafer convey path 9 and the wafer convey arm 10. In this processing system, for example, one of the unprocessed wafers W housed in a wafer cassette (not shown) of the loader section 1 is extracted and conveyed. Cleaning, an adhesion process, cooling, resist coating, pre-baking, and exposure by an exposure unit (not shown) are sequentially performed on the conveyed wafer. After a developing process is performed on the resultant wafer W in the developing unit 8 as a resist processing apparatus according to the present invention, the wafer W is post-baked. Then, the processed wafer W is conveyed and housed in the wafer cassette of the loader section 1.

Figure 2:
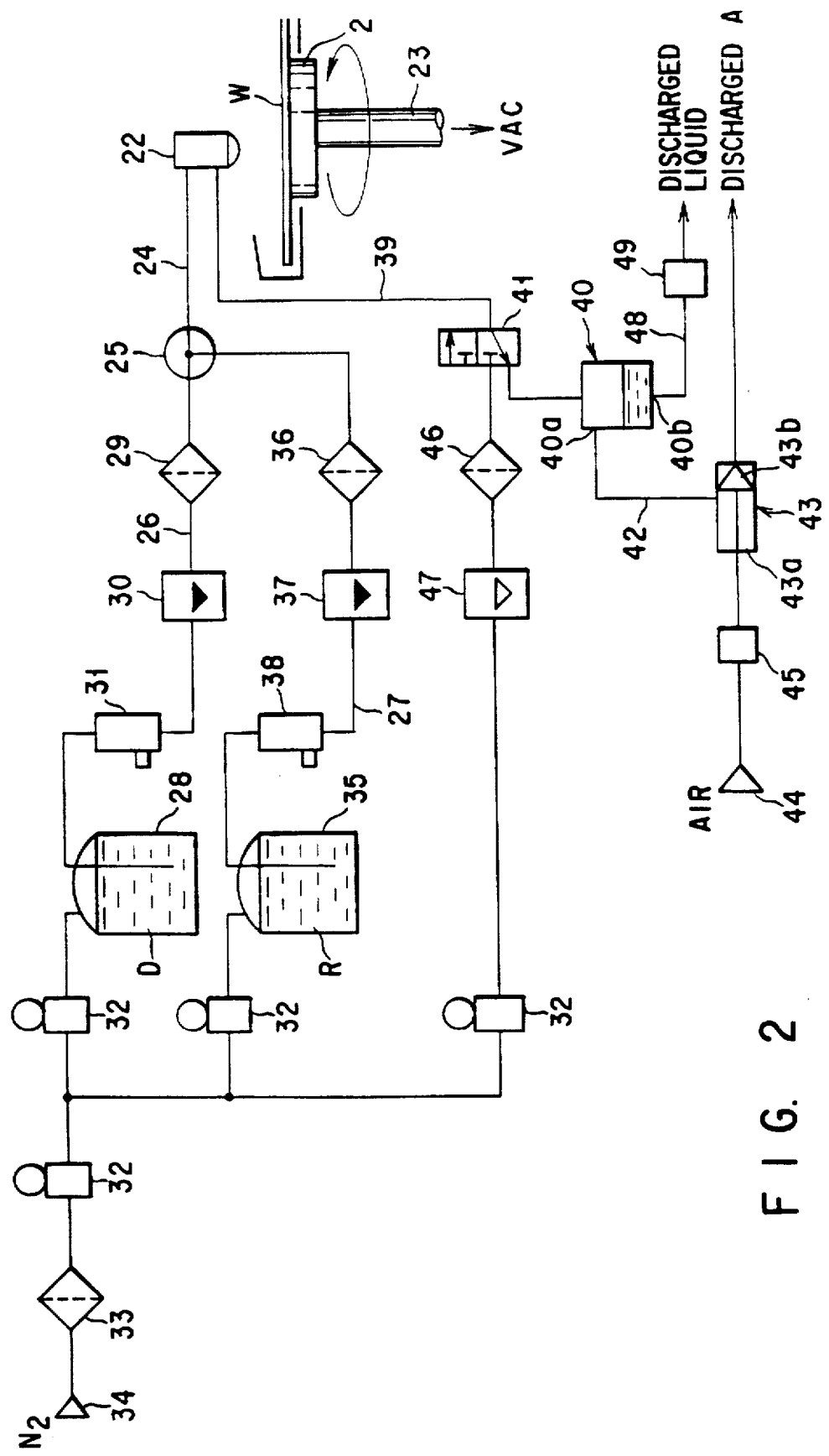
FIGS. 2 and 3 are diagrams for explaining the resist processing method according to the first aspect.

As shown in FIG. 2, each developing unit 8 is mainly constituted by a spin chuck 20 for holding the wafer W by suction of a vacuum unit (not shown), and horizontally rotating it, a processing cup 21 arranged to surround the wafer holding portion of the spin chuck 20, and a supply nozzle 22 for supplying process solutions such as a developing solution and a cleaning solution and a rinse solution such as distilled water onto the wafer W. In this case, the spin chuck 20 is arranged to be movable in the vertical direction in accordance with driving of an elevating cylinder (not shown) coupled to a rotating shaft 23. The processing cup 21 is also arranged to be movable in the vertical direction by the elevating cylinder (not shown).

A merging pipe 24 for supplying the developing solution and the rinse solution is connected to the supply side of the supply nozzle 22. A developing solution supply pipe 26 and a rinse solution supply pipe 27 are connected to the merging pipe 24 through a three-way selector valve 25, respectively. The developing solution supply pipe 26 is connected to a developing solution tank 28 for containing a developing solution D. A filter 29, a mass-flow controller 30, and a flowmeter 31 are interposed in the developing solution supply pipe 26 in an order from the three-way selector valve 25 to the developing solution tank 28. A supply source 34 for an inert gas such as a nitrogen ($N_2$) gas is connected to the developing solution tank 28 through regulators 32 and a filter 33. The developing solution D in the developing solution tank 28 is transferred to the supply nozzle 22 by the compressed $N_2$ gas supplied from the $N_2$ gas supply source 34, and is supplied onto the wafer W. The rinse solution supply pipe 27 is connected to a rinse solution tank 35 for containing a rinse solution R. A filter 36, a mass-flow controller 37, and a flowmeter 38 are interposed in the rinse solution supply pipe 27 in an order from the three-way selector valve 25 to the rinse solution tank 35. The $N_2$ gas supply source 34 is connected to the rinse solution tank 35 through the regulators 32 and the filter 33. The rinse solution R in the rinse solution tank 35 is transferred to the supply nozzle 22 by the compressed $N_2$ gas supplied from the $N_2$ gas supply source 34, and is supplied onto the wafer W. In this manner, the developing solution D and the rinse solution R are supplied from the common supply nozzle 22 onto the surface of the wafer W through the merging pipe 24. With this arrangement, one or a mixture of the developing solution D and the rinse solution R can be supplied onto the same position, thereby avoiding development nonuniformity caused by scum of the resist dissolved in the developing solution D.

The distal end portion of a discharge pipe 39 is connected to the supply nozzle 22 at a position different from but adjacent to the supply portion of the developing solution D and the rinse solution R. The $N_2$ gas supply source 34 or a trap tank 40 serving as an air/bubble separation means is connected to the discharge pipe 39 through a three-port two-position selector valve 41. An ejector 43 (pneumatic type vacuum unit) is connected to an air discharge pipe 42 which is connected to a bubble drawing port 40a at the upper portion of the trap tank 40. The ejector 43 has a structure in which, e.g., an injection nozzle 43b for compressed air is inserted into an air chamber 43a connected to the air discharge pipe 42, and the injection port of the injection nozzle 43b is arranged to face a discharge side. Compressed air supplied from a compressed air supply source 44 connected to the injection nozzle 43b is injected from the injection nozzle 43b to discharge air in a discharged liquid recovered in the trap tank 40 by using a Bernoulli effect through the air discharge pipe 42. In this case, an opening/closing valve 45 is interposed between the injection nozzle 43b of the ejector 43 and the compressed air supply source 44. The operation of the ejector 43 is controlled by adjusting opening/closing of the opening/closing valve 45 to always keep the interior of the trap tank 40 at a negative pressure. With this operation, the discharged liquid is prevented from flowing into the air discharge pipe 42 side. A filter 46, a mass-flow controller 47, and another regulator 32 are interposed between the three-port two-position selector valve 41 and the $N_2$ gas supply source 34. An opening/closing valve 49 is interposed in a liquid discharge pipe 48 connected to a drain port 40b of the trap tank 40.

As described above, the $N_2$ gas supply source 34 and the ejector 43 are switchably connected to the supply nozzle 22 through the air discharge pipe 42. With this arrangement, when the supply nozzle 22 retreats from the wafer W and waits, the developing solution D or the rinse solution R is prevented from dropping on the wafer W. Further, the $N_2$ gas is supplied to the supply nozzle 22 upon the processes to clean the interior of the supply nozzle 22.

The operation of developing the wafer W having a polyimide-based resist film on which a circuit pattern is transferred by using the developing unit having the above arrangement will be described with reference to FIG. 4.

First, the processing cup 21 is moved downward, and the spin chuck 20 receives the exposed wafer W from the wafer convey arm 10 of the wafer convey mechanism 11. Then, the processing cup 21 is moved upward to hold the wafer W. The supply nozzle 22 is moved above the center of the wafer W from a waiting position by a moving mechanism (not shown). The rinse solution R is injected (supplied) to the surface of the wafer W rotating in accordance with the driving of the spin chuck 20 at a flow rate of, e.g., about 130 cc/min MAX for 1 to 2 seconds to form a liquid film of the rinse solution R (pre-processing step).

Next, the developing solution D is injected at a flow rate of, e.g., 130 cc/min MAX for about 60 seconds to perform spray development (processing step). The rotational speed of the wafer W in the pre-processing and processing steps is about 1,000 rpm. The rinse solution R is supplied at a flow rate of, e.g., 130 cc/min MAX about 3 seconds before the end of supply of the developing solution D (first post-processing step). The rinse solution R is supplied for about 10 to 20 seconds at the end of the supply of the developing solution D (second post-processing step). The rotational speed of the wafer W in the first and second post-processing steps is 1,000 to 1,500 rpm. As shown in FIG. 5A, when the developing solution D is to be supplied upon the supply of the rinse solution R, the supply of the developing solution D may start before the end of the supply of the rinse solution R to supply the rinse solution R and the developing solution D at the same time. With this operation, the developing solution D can be supplied following the liquid film formed by the rinse solution R, and the developing solution D can spread more smoothly.

As described above, the developing solution D and the rinse solution R are supplied onto the surface of the wafer W so as to hit more strongly compared to a case of a normal resist except for a polyimide-based resist. The resist film is dissolved and shaved to wash away a dissolved material passively. With this operation, even if the resist film has a thickness of 10 μm, this resist film can be developed for 60 seconds, which is about 10 times higher than a developing speed for a normal resist film (i.e., a film having a thickness of 1 μm is developed for 60 seconds). Note that the line width of the circuit pattern of the polyimide-based resist is 3 μm, which is larger than the line width (0.5 μm) of a circuit pattern of the normal resist. For this reason, if the developing solution D and the rinse solution R strongly hit the surface of the wafer W to shave the film, no problem occurs in terms of a pattern formation process.

Figure 3:
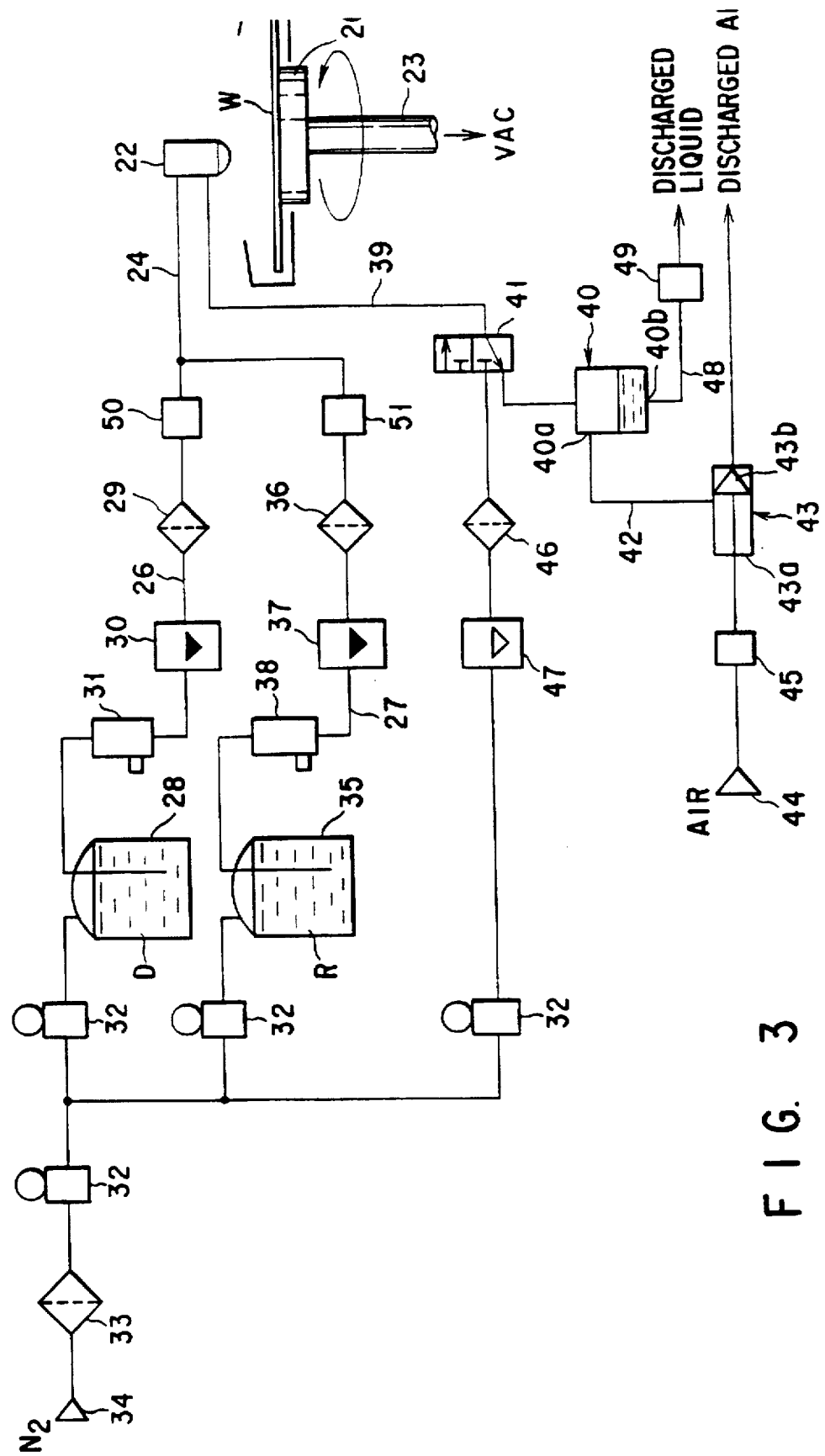

FIG. 3 is a schematic view showing another example of the developing unit according to the first aspect of the present invention. In this example, timings and supply amounts used when the rinse solution and the developing solution are to be supplied at the same time can be changed. That is, opening/closing valves 50 and 51 are respectively interposed in the developing solution supply pipe 26 and the rinse solution supply pipe 27 at the upstream side of the connection portion of the merging pipe 24. By opening/closing operations of the opening/closing valves 50 and 51, the supply timings and the supply amounts of the developing solution D and the rinse solution R can be changed. Note that the same reference numerals as in FIG. 2 denote the same parts in this example, and a detailed description thereof will be omitted.

Assume that the wafer W having a polyimide-based resist film on which a circuit pattern is transferred is developed by using the developing unit having the above arrangement. As shown in FIG. 5B, when supply of the developing solution D starts before the end of supply of the rinse solution R, the supply amount of the developing solution D is gradually increased (increased, e.g., from 0 to 130 cc/min in 1 to 2 seconds) by operating the opening/closing valves 50 and 51 to supply the rinse solution R and the developing solution D at the same time.

Figure 6A:
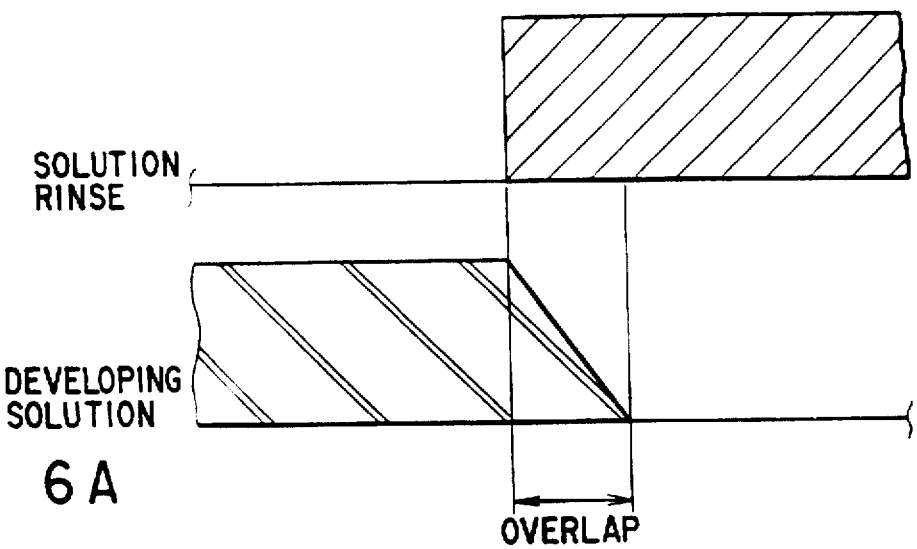
Figure 6B:
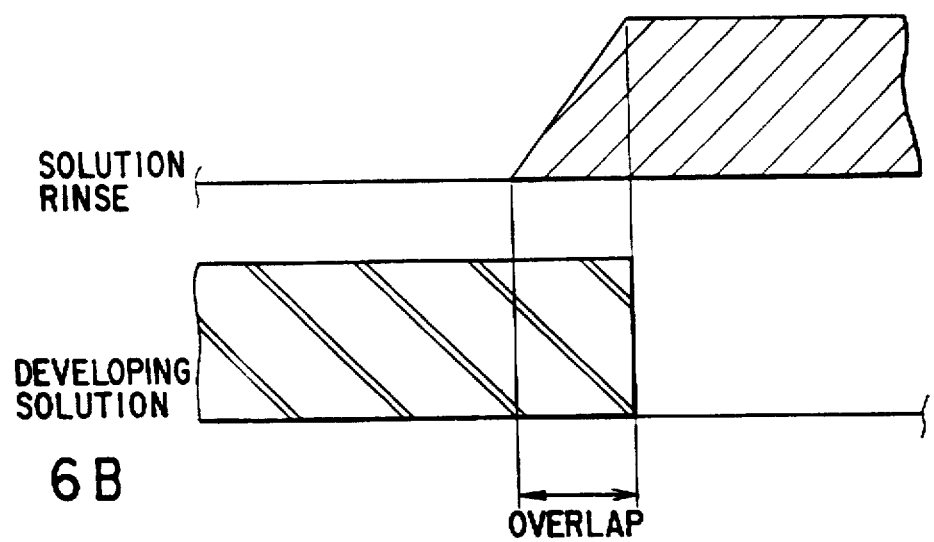
Figure 6C:
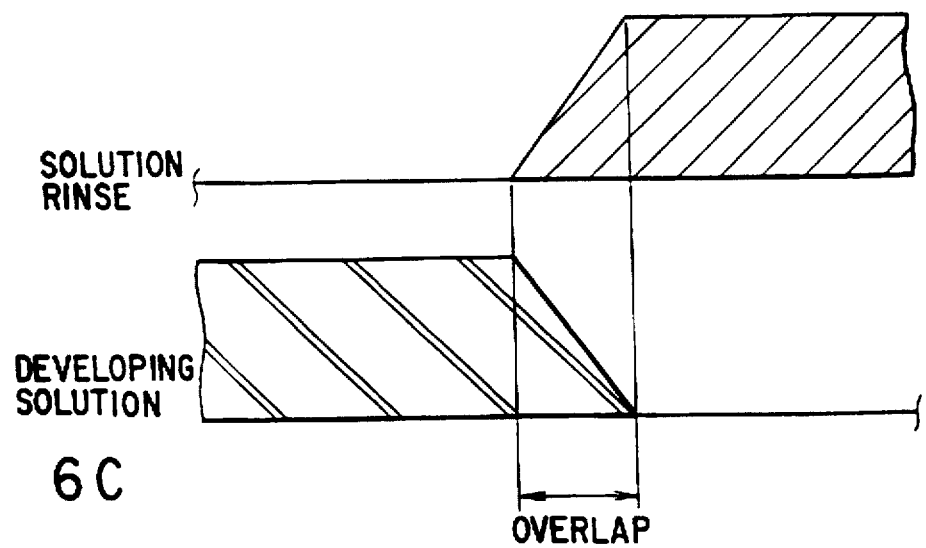

When the rinse solution R is supplied about 3 seconds before the end of the supply of the developing solution D (in the first post-processing step), by operating the opening/closing valves 50 and 51, the supply amount of the developing solution D is gradually decreased (decreased, e.g., from 130 cc/min to 0 in 3 seconds) as shown in FIG. 6A, the rinse solution R is gradually increased (increased, e.g., from 0 to 130 cc/min in 3 seconds) as shown in FIG. 6B, or the developing solution D is gradually decreased (decreased, e.g., from 130 cc/min to 0) and the rinse solution R is gradually increased (increased, e.g., from 0 to 130 cc/min)

as shown in FIG. 6C. In this manner, the developing solution D and the rinse solution R are mixed and substituted by gradually changing their concentrations. The developing solution D and the rinse solution R which are heterogeneous liquids are mixed well to supply the solution mixture. Particularly, when the supply of the developing solution D starts before the end of the supply of the rinse solution R, the developing solution D is gradually increased (increased, e.g., from 0 to 130 cc/min) to gradually increase the concentration of the developing solution D. Therefore, development can be performed in a well-mixed state of the developing solution D and the rinse solution R, realizing uniform development.

This embodiment exemplifies the case in which the developing solution D and the rinse solution R are supplied from the common supply nozzle 22 onto the surface of the wafer W through the merging pipe 24. The developing solution D and the rinse solution R are not necessarily supplied from the common supply nozzle 22. For example, a developing solution supply nozzle and a rinse solution supply nozzle, which have the same shape so as to obtain the same injection pattern, may be arranged adjacent to each other. In addition, this embodiment exemplifies the case in which the developing solution D and the rinse solution R are supplied from the spray type supply nozzle 22 onto the surface of the wafer W. A paddle type supply nozzle which ejects a solution in a curtain-like manner can be used instead of the spray type supply nozzle. Furthermore, this embodiment exemplifies the case of using the wafer as an object to be processed. This embodiment can also be applied to a case of processing, e.g., an LCD substrate, a ceramic substrate, or the like.

(Embodiment 2)

This embodiment will exemplify a case in which the second aspect of the present invention is applied to a developing unit for an LCD substrate.

Figure 7:
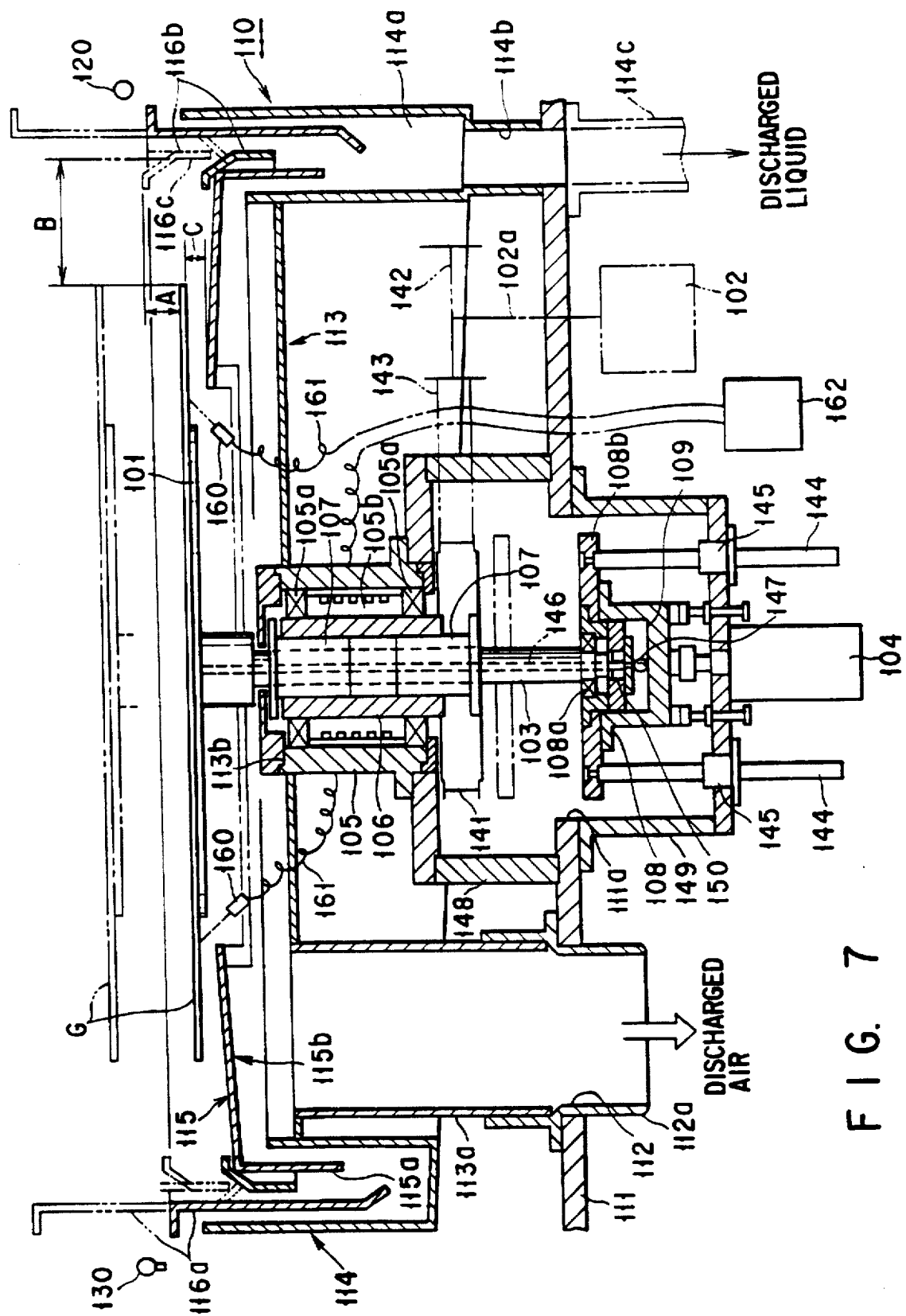
FIGS. 7 and 12 are sectional views showing a resist processing apparatus used to practice a resist processing method according to the second aspect of the present invention.
Figure 8:
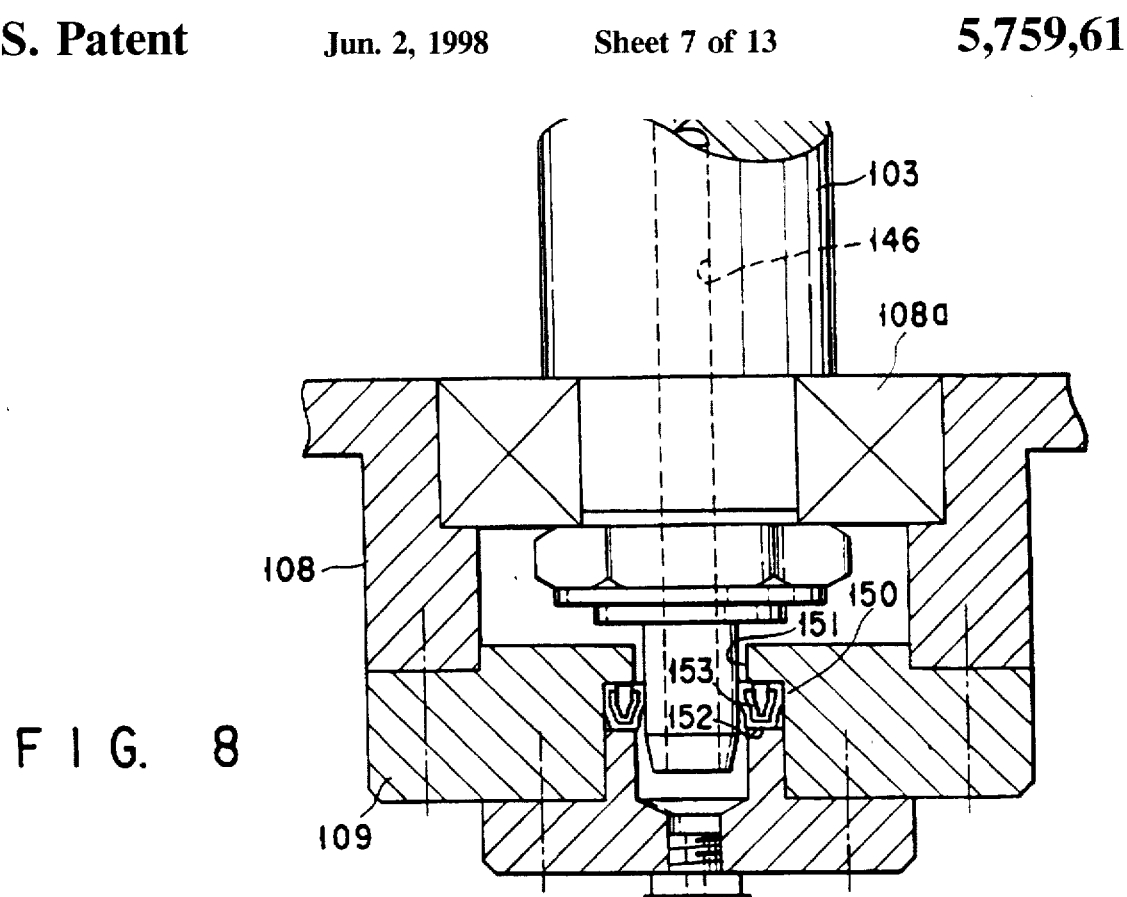
FIG. 8 is an enlarged sectional view showing the main part of the resist processing apparatus in FIG. 7.

FIG. 7 is a schematic sectional view showing a resist processing apparatus as the second aspect of the present invention, and FIG. 8 is an enlarged sectional view showing its main part. This resist processing apparatus is mainly constituted by a spin chuck 101 as a holding means for holding a quadrilateral object to be processed, e.g., a rectangular LCD substrate G (to be referred to as a substrate hereinafter) by suction of a vacuum unit (not shown), and rotating the substrate G in the horizontal direction, a vessel 110 arranged to surround the spin chuck 101, a process solution supply means, e.g., a developing solution supply nozzle 120 for supplying a process solution such as a developing solution onto the substrate G, and a rinse solution supply nozzle 130 for supplying deionized water or distilled water, and then a process solution such as a rinse solution onto the substrate G.

The spin chuck 101 is rotatable (rotatable about its axis) in the horizontal direction through a hollow rotating shaft 103 which is rotated in accordance with driving of a driving motor 102, and is movable in the vertical direction in accordance with driving of an elevating cylinder 104 coupled to the rotating shaft 103. In this case, the upper surface of the spin chuck 101 is arranged to hold the rectangular substrate G having a maximum size of, e.g., 500×400 mm by vacuum suction. The rotating shaft 103 of the spin chuck 101 is slidably coupled to a spline bearing 107 fitted in the inner surface of an inner rotating cylinder 106 which is rotatably mounted on the inner surface of a fixed collar 105 arranged in the vessel 110 through a bearing 105a and a labyrinth seal 105b. A driven pulley 141 is mounted on the spline bearing 107. A belt 143 is looped between the driven pulley 141 and a driving pulley 142 mounted on a driving shaft 102a of the driving motor 102 arranged outside the vessel 110. Therefore, when the rotating shaft 103 is rotated in accordance with driving of the driving motor 102 through the belt 143, the spin chuck 101 is rotated. The lower portion side of the rotating shaft 103 is arranged at the lower portion side of the vessel 110, and set through a bearing 108a in a movable collar 108 which is vertically movable by the elevating cylinder 104 arranged outside the vessel 110. In addition, the rotating shaft 103 is coupled to an elevating cylinder 123 through a seal mechanism 150 in the movable collar 108, and is vertically movable in accordance with driving of the elevating cylinder 123.

A slide shaft 144 is mounted on a flange portion 108b of the movable collar 108. The slide shaft 144 is slidably fitted in a guide cylinder 145 fixed to a base portion 111 of the vessel 110, and this arrangement allows smooth vertical movement of the spin chuck 101. The spin chuck 101 is connected to a vacuum pump (not shown) through a passage 146 provided to the rotating shaft 103 and an air discharge pipe 147 connected to the passage 146. The interior of the vessel 110 is evacuated by driving the vacuum pump, and the spin chuck 101 holds the substrate G thereon by vacuum suction.

Figure 9:
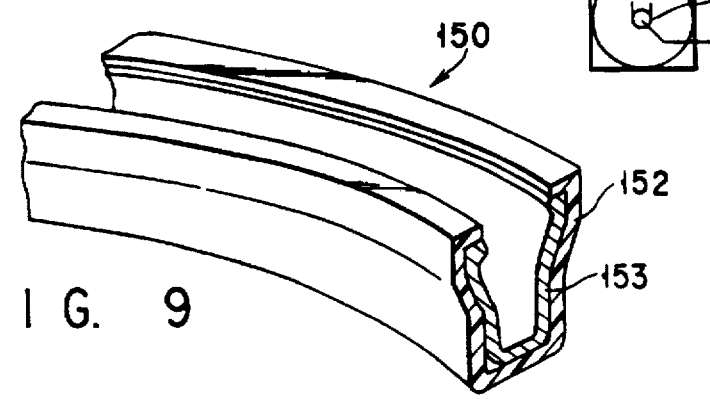
FIG. 9 is a perspective sectional view showing the main part of a seal mechanism of the resist processing apparatus in FIG. 7.
Figure 10:
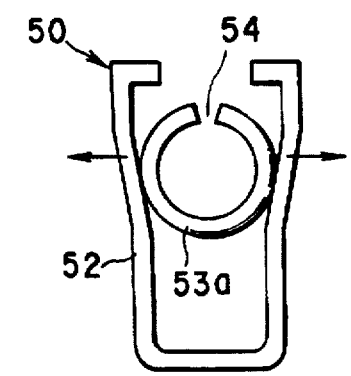
FIG. 10 is a schematic sectional view showing the seal mechanism in FIG. 9.

The seal mechanism 150 is interposed in a gap 151 between the rotating shaft 103 and the vessel 110 (more specifically, a movable wall 109 fixed to the movable collar 108). The seal mechanism 150 shields the vessel 110 from the outside to perform vacuum suction of the spin chuck 101 satisfactorily. As shown in FIGS. 8 to 10, the seal mechanism 150 is constituted by an annular seal member 152, having an almost U-shaped sectional surface, for closing the gap 151 between the rotating shaft 103 and the movable wall 109, and a spring member 153, having an almost U-shaped sectional surface, for pressing the seal member 152 against the rotating shaft 103 and the movable wall 109, i.e., the vessel side. The seal member 152 has flexibility of a fluoroplastic resin material such as Teflon (tradename). The spring member 153 consists of, e.g., stainless steel.

Figures 11A, 11B:
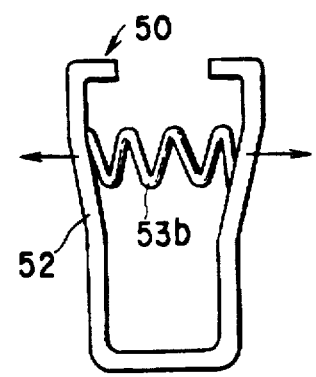
FIGS. 11A and 11B are schematic sectional views showing other examples of the seal mechanism.

By using the seal mechanism 150 having this arrangement, the seal member 152 is always pressed against the rotating shaft 103 and the movable wall 109 (vessel side) by the elasticity of the spring member 153. For this reason, even if a small error in size of the gap 151 is produced in setting of the spin chuck 101, the seal mechanism 150 can absorb the error to easily perform positioning of the rotating shaft 103. Even if the rotating shaft 103 axially vibrates during rotation of the spin chuck 101, the seal member 152 is always pressed against the rotating shaft 103 and the movable wall 109 by the elasticity of the spring member 153 to always keep a good sealed state. Even if the shaft axially vibrates, this vibration is prevented from being transmitted to the movable wall 109, thereby avoiding backlash of the processing apparatus. Further, since the seal member 152 is deformable, its wear can be reduced. By using the seal mechanism 150 having the above arrangement, the rotating shaft 103 of the spin chuck and the gap 151 at the vessel side can be airtightly sealed regardless of its size. Still further, the spin chuck 101 is easily set and maintained, and the service life of the spin chuck 101 and the entire apparatus can be prolonged. Note that the seal mechanism 150 is not limited to the above structure. For example, as shown in FIG. 11A, a spring member 153a, having a slit 154, whose sectional surface is a circle may be disposed in the seal member 152, or a bellows-like spring member 153b may be disposed in the seal member 152 as shown in FIG. 11B.

The vessel 110 is mainly constituted by an air discharge passage 113a communicating with an air discharge port 112 formed in the base portion 111, a lower vessel 113 having a mounting hole 113b for the fixed collar 105 arranged on the base portion 111, a base portion 114 of the vessel positioned around the lower vessel 113 and having a circumferential groove 114a whose bottom surface is inclined, an inner vessel 115 having an inclined piece 115b which is inclined upward from the upper end of a hanging piece 115a hanging in the circumferential groove 114a of the base portion 114 of the vessel toward the lower surface side of the substrate G held on the spin chuck 101, a first cylindrical outer vessel 116a positioned outside the inner vessel 115 and extending to the circumferential groove 114a of the base portion 114 of the vessel to appear/disappear by an elevating means (not shown), and a second cylindrical outer vessel 116b extending outward above the inner vessel 115 upon upward movement of the first outer vessel 116a. In this case, the air discharge port 112 or the air discharge passage 113a is provided at one portion in FIG. 7, but the two air discharge ports 112 or the two air discharge passage 113a are concentrically provided in practice. An air discharge pipe 112a in which an air discharge unit (not shown) is interposed is connected to each air discharge port 112. A liquid discharge port 114b for connecting a liquid discharge pipe 114c is formed in the bottom portion at the lowest side of the circumferential groove 114a of the base portion 114 of the vessel.

An opening 111a in which the rotating shaft 103 of the spin chuck 101 is fitted is formed in the base portion 111 on which the vessel 110 having the above arrangement is set. The fixed collar 105 is set above the opening 111a through a rotation driving transmission chamber 148 in which the driven pulley 141 is disposed to surround the opening 111a. An elevating driving chamber 149 in which the movable collar 108 is disposed is set below the opening 111a.

Note that cleaning water injection nozzles 160 for injecting a cleaning water to the lower surface of the substrate G are provided at the lower side around the holding portion of the spin chuck 101. The cleaning water injection nozzles 160 are arranged at eight portions (only two portions are shown in FIG. 7) on the circumference of the spin chuck 101 at an equal angular interval. Each injection nozzle 160 is connected to a cleaning water supply source 162 through a cleaning water supply pipe 161, and is arranged to be capable of injecting the cleaning water as needed. In this case, the injection nozzles 160 may be fixed to have different injection angles with respect to the substrate G, or a nozzle angle adjustment mechanism (not shown) may be provided to change the injection angles of the injection nozzles 160.

When the substrate G is to be loaded into the vessel 110 having the above arrangement, the spin chuck 101 is moved upward in a state wherein the first and second outer chambers 116a and 116b are kept down. After the substrate G conveyed by a convey arm (not shown) is held on the spin chuck 101 by suction, the spin chuck 101 is moved downward, and the substrate G is loaded into the vessel 110. Thereafter, the substrate G is developed in a state wherein the first and second outer chambers 116a and 116b are kept up.

When a developing solution is coated on the surface of the substrate G loaded into the vessel 110 in this manner, an air discharge side and a liquid discharge side must be chucked to prevent the developing solution from scattering and reattaching to the substrate G. In this case, consideration must be taken that a turbulent flow does not occur around the substrate G. For this reason, according to this embodiment, a size A between the upper surface of the substrate G and the opening end of the second outer vessel 116b is set at 10 to 20 mm, a size B between a short side at the end of long side of the substrate G and a side wall 116c of the second outer vessel 116b is 15 to 75 mm, and a size C between the lower surface of the substrate G and the top surface of the inclined piece 115b of the inner vessel 115 is 10 to 25 mm.

Figure 12:
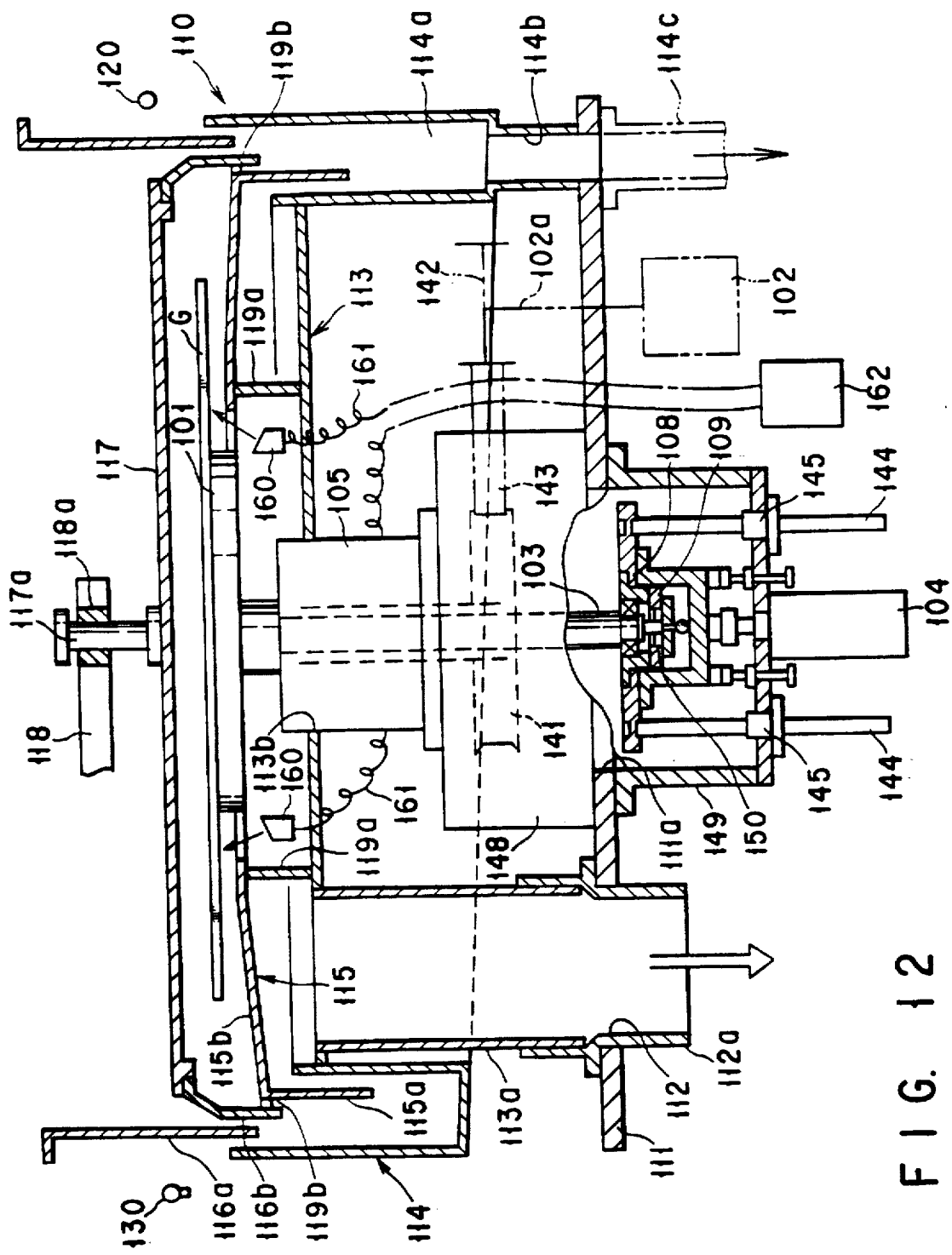

This embodiment exemplifies the vessel 110 whose upper portion is open. Alternatively, a lid may be provided to cover the opening portion of the vessel 110, and a developing process may be performed while the vessel 110 is rotated with the spin chuck 101. For example, as shown in FIG. 12, a suspending portion 117a is provided at the central portion of a lid 117 which fits in the upper opening portion of the second outer vessel 116b, and the suspending portion 117a is supported by a vertically movable suspended arm 118 through a bearing 118a. With this arrangement, the lid 117 can be vertically moved in accordance with the vertical movement of the suspended arm 118, and can be rotated. On the other hand, the inner vessel 115 is mounted on the spin chuck 101. The inner vessel 115 is also brought into slidable contact with an abutment portion 119a which stands on the upper surface of the lower vessel 113, and is sealed. The second outer vessel 116b is mounted on the outside of the inner vessel 115 through a mounting member 119b. With this arrangement, when the spin chuck 101 is rotated, the inner vessel 115, the second outer vessel 116b, and the lid 117 are integrally rotated. Therefore, a developing solution can be coated on the surface of the substrate G in the closed vessel. In this case, the developing process can be performed without being affected by external factors such as a turbulent flow.

The size of the mounting member 119b is minimized to allow a smooth air flow. For example, a plurality of bar members are provided. An opening portion must be formed in the mounting portion of the spin chuck 101 and the inner vessel 115 so as to allow to inject cleaning water on the lower surface of the substrate G. In FIG. 12, other portions are the same as in the above embodiment, so the same reference numerals denote the same parts, and a detailed description thereof will be omitted.

Figure 13:
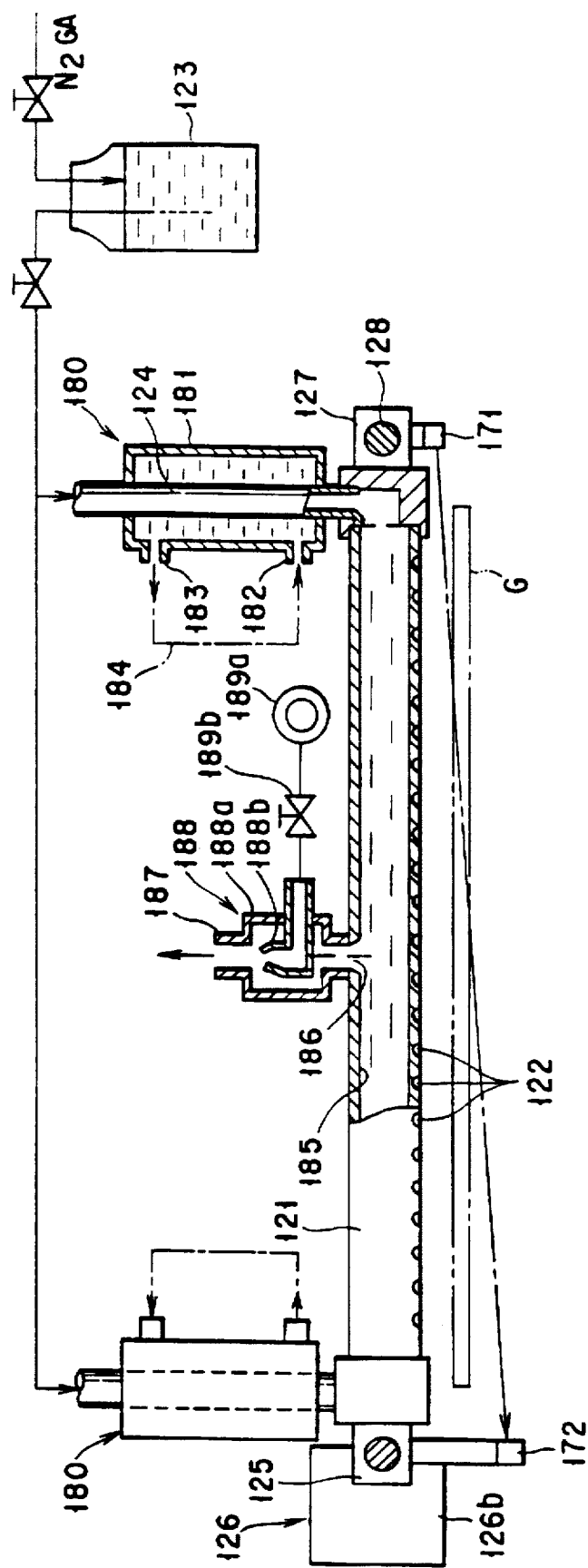
FIGS. 13 and 16 are sectional views showing a process solution supply means of the resist processing apparatus according to the second embodiment.
Figure 14:
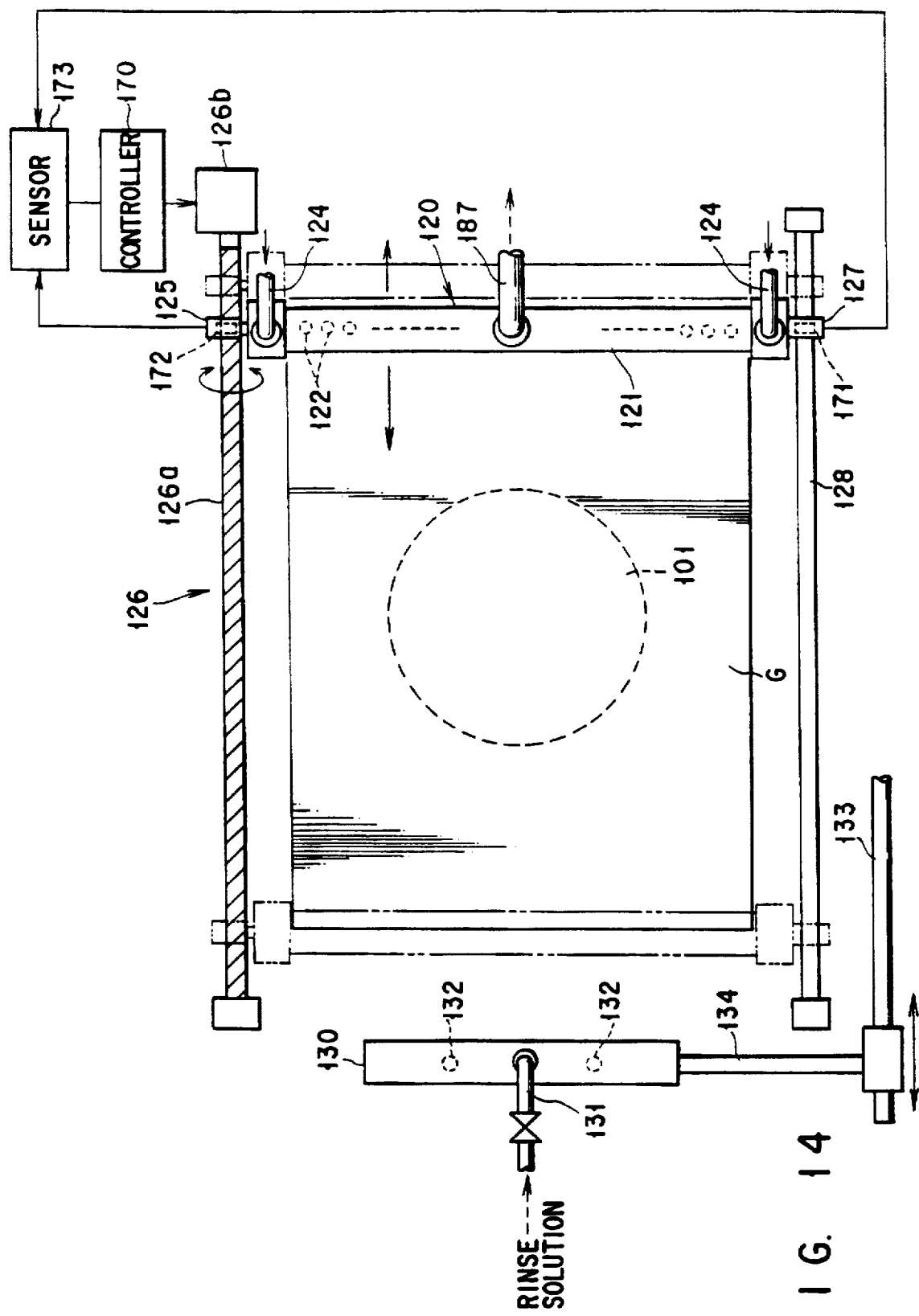
FIGS. 14 and 17 are plan views showing an example of a moving mechanism of the process solution supply means and a cleaning solution supply means.

As shown in FIGS. 13 and 14, the developing solution supply nozzle 120 has a length corresponding to one entire side (short side) of the substrate G. The developing solution supply nozzle 120 is constituted by a pipe-like developing solution container 121 which has two closed ends and consists of, e.g., vinyl chloride, and apertures 122 which are arranged at an interval of, e.g., 1.5 mm, and have a diameter of about 0.4 mm. Developing solution supply/discharge pipes 124 are connected to the two end portions of the developing solution container 121 of the developing solution supply nozzle 120. The developing solution supply/discharge pipes 124 are also connected to a developing solution containing tank 123 for containing a developing solution as a process solution. The developing solution is supplied to the developing solution supply nozzle 120 by a compressed $N_2$ gas introduced into the developing solution containing tank 123. The developing solution is supplied such that it oozes out in a curtain-like manner from the apertures 122 onto the surface of the substrate.

Figure 15:
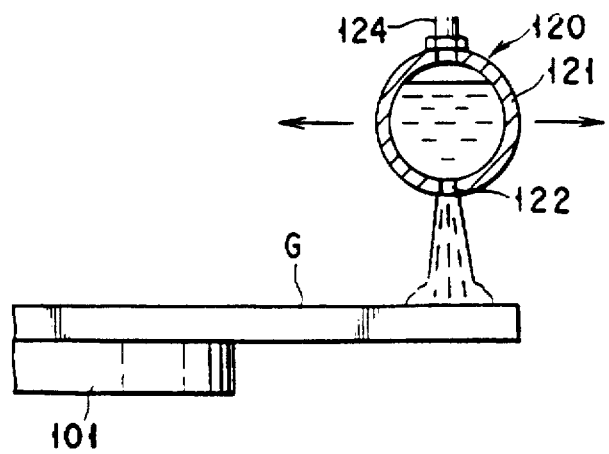
FIG. 15 is a view for explaining the operation of the process solution supply means.

A support arm 125 extends from one end of the developing solution container 121. A moving shaft 126a of a moving means 126 which is constituted by a ball screw is engaged with the support arm 125. The developing solution supply nozzle 120 can be relatively moved in the longitudinal direction of the substrate G by the moving shaft 126a which is rotated clockwise and counterclockwise by, e.g., a stepping motor 126b. A guide arm 127 extends from the other end of the developing solution supply nozzle 120. The guide arm 127 is slidably mounted on a guide rail 128 disposed parallel to the moving shaft 126a. This arrangement allows smooth movement of the developing solution supply nozzle 120. In this case, clockwise or counterclockwise rotation of the stepping motor 126b and a rotation time thereof are determined in accordance with a signal from a controller 170. After the developing solution supply nozzle 120 is arranged near the end portion of a long side of the substrate G, the developing solution supply nozzle 120 is returned to one end of the substrate G, as shown in FIG. 15. Then, the stepping motor 126b is rotated counterclockwise to move the developing solution supply nozzle 120 to the other end of the substrate G. As shown in FIGS. 13 and 14, an optical sensor 173 constituted by a light-emitting portion 171 and a light-receiving portion 172 is provided. The light-emitting portion 171 and the light-receiving portion 172 are mounted on the support arm 125 and the guide arm 127 of the developing solution supply nozzle 120, respectively. With this arrangement, this optical sensor 173 detects movement of the developing solution supply nozzle 120 to the end portion of the substrate G. This detection signal is sent to the controller 170 to stop the movement of the developing solution supply nozzle 120.

A temperature adjustment mechanism 180 is provided to each developing solution supply/discharge pipe 124 of the developing solution supply nozzle 120 near the developing solution supply nozzle 120. The developing solution is set at a predetermined temperature of, e.g., 23° C. by this temperature adjustment mechanism 180. In this case, the temperature adjustment mechanism 180 is constituted by a temperature chamber 181 which covers the developing solution supply/discharge pipe 124, and a supply/discharge pipe 184 for a temperature adjustment solution connected to a flow inlet port 182 and a flow outlet port 183 which are formed in the temperature chamber 181. The temperature of the developing solution which is supplied to the developing solution container 121 can be maintained at a predetermined value by heat exchange between the developing solution flowing through the developing solution supply/discharge pipe 124 and the temperature adjustment solution. Note that the substrate G is not required to have a fine line width in comparison with that of a wafer. For this reason, the temperature is adjusted in the developing solution supply/ discharge pipes 124 near the developing solution supply nozzle 120 to sufficiently manage the temperature. Therefore, the developing solution supply nozzle 120 can have a hollow pipe-like shape, and its structure can be simple and lightweight. The developing solution can be set at an optimal temperature for a coating process of the developing solution, e.g., 23° C. (temperature gradient: ±1° C.). The yield of the developing process and the throughput can be increased.

Figure 16:
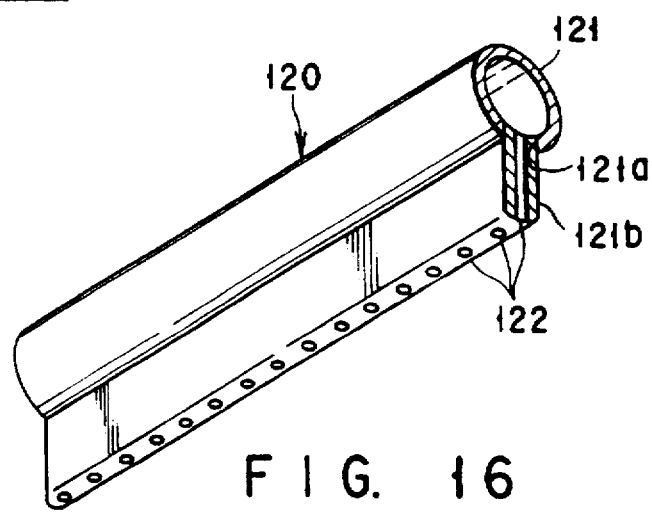

The apertures 122 are directly formed in the developing solution supply nozzle 120. In addition to this, for example, a slit 121a may be formed in the lower surface of the hollow pipe-like developing solution container 121 in the longitudinal direction, and an injection head 121b in which the large number of apertures 122 are formed may be fixed on the slit 121a by welding, as shown in FIG. 16.

A bubble drawing port 186 is formed in the upper center of the developing solution container 121 of the developing solution supply nozzle 120. A suction amount adjustment mechanism 188 is interposed in a bubble discharge pipe 187 connected to the bubble drawing port 186. The suction amount adjustment mechanism 188 has a structure in which an injection nozzle 188b for, e.g., compressed air is inserted into an air chamber 188a connected to the bubble discharge pipe 187, and the injection port of the injection nozzle 188b is arranged toward a discharge side. Bubbles produced in the developing solution supply nozzle 120 can be discharged from the bubble discharge pipe 187 by injecting compressed air from the injection nozzle 188b by a Bernoulli effect. In this case, an upper inner surface 185 of the developing solution container 121 is an inclined surface with an upward gradient toward the center. With this structure, bubbles tend to gather toward the bubble drawing port 186, and the bubbles can be further smoothly discharged. In this manner, since bubbles produced in the developing solution are discharged outside from the bubble discharge pipe 187, the bubbles do not attach to the surface of the substrate G. Bubbles may be drawn, e.g., in units of lots of the substrates G, every process for a predetermined number of substrates G, every predetermined lapse of time, or upon detection of bubbles by a bubble detection means (not shown). In FIG. 13, reference numerals 189a and 189b denote a compressed air supply source and a flow rate adjustment valve, respectively. The injection amount of compressed air and the suction amount of bubbles can be adjusted by adjusting the flow rate adjustment valve 189b.

A rinse solution supply pipe 131 is connected to the upper portion of the rinse solution supply nozzle 130, and rinse solution injection heads 132 are provided at two portions of the lower surface of the rinse solution supply nozzle 130. The rinse solution supply nozzle 130 is arranged to be movable above the substrate G held by the spin chuck 101 by a moving arm 134 which moves along a convey rail 133. The convey rail 133 is arranged parallel to the moving shaft 126a and the guide rail 128.

Figure 17:
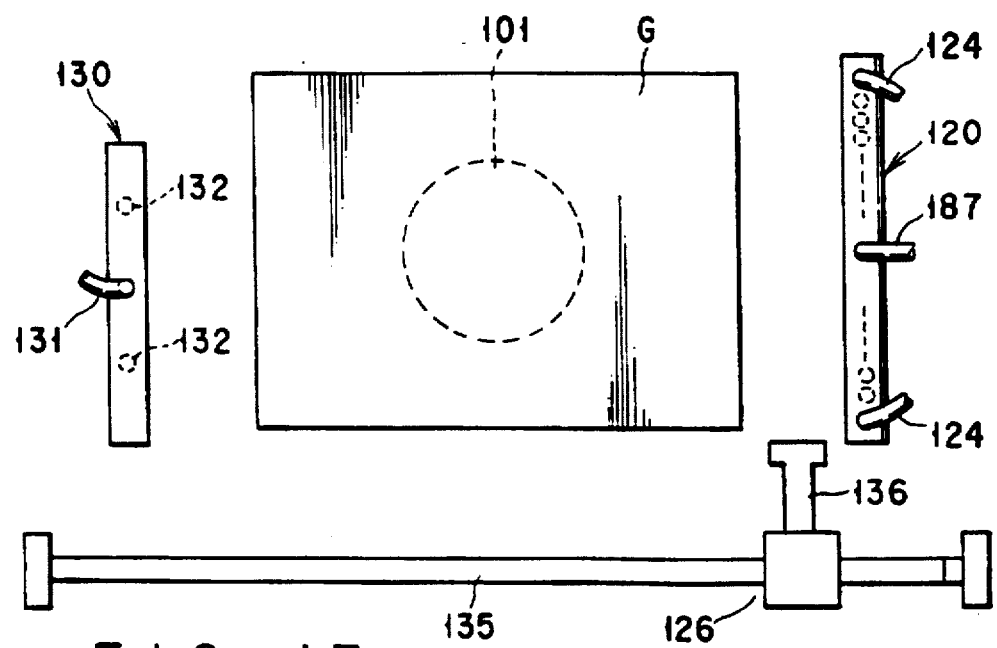

In the above embodiment, the developing solution supply nozzle 120 and the rinse solution supply nozzle 130 are moved by different driving means. Alternatively, they can be moved by the same driving means. That is, as shown in FIG. 17, a convey rail 135 disposed parallel in the longitudinal direction of the substrate G held by the spin chuck 101 by suction is provided, and a grip arm 136 which can be moved by a moving mechanism (not shown) driven by, e.g., an air cylinder, or a stepping motor is provided. The grip arm 136 may be arranged to grip the developing solution supply nozzle 120 or the rinse solution supply nozzle 130. In order to grip the developing solution supply nozzle 120 or the rinse solution supply nozzle 130 by the grip arm 136, a mechanical chuck mechanism using, e.g., an air cylinder, a vacuum suction type chuck mechanism, an electromagnetic type chuck mechanism, or the like can be used.

Next, a method of coating a developing solution on the substrate G by using the processing apparatus according to the second aspect of the present invention will be described with reference to FIGS. 18A to 18E. First, as shown in FIG. 18A, the conveyed substrate G is placed on the spin chuck 101, and held by the spin chuck 101 by suction. The developing solution supply nozzle 120 is arranged above the end portion of the short side of the substrate G so as to position the apertures 122 inward the edge of the substrate G by about 5 mm. The developing solution is supplied from the developing solution supply nozzle 120 onto the substrate G.

As shown in FIG. 18B, the developing solution supply nozzle 120 is moved back to one edge of the substrate G while supplying the developing solution. The developing solution is coated on the end portion of the substrate G (①). As shown in FIG. 18C, the developing solution supply nozzle 120 is moved to the other edge of the substrate G, and the developing solution is coated on the entire surface of the substrate G. Thereafter, the supply of the developing solution is stopped, and the developing solution supply nozzle 120 is waited at that position or moved back to the original waiting position ((2) and (3)). As shown in FIG. 18D, the spin chuck 101 is rotated clockwise and counterclockwise at, e.g., 10 rpm and 3 sec/cycle to scatter the developing solution coated on the substrate G outward by a centrifugal force. The developing solution is brought into good contact with the substrate G. Finally, as shown in FIG. 18E, the spin chuck 101 is continuously rotated at about 200 rpm to shake off the developing solution. The rinse solution supply nozzle 130 is moved above the substrate G, and the rinse solution is supplied from the rinse solution supply nozzle 130 onto the substrate G to stop the development.

The resist processing apparatus having the above arrangement can be used as a single apparatus, as a matter of course. In addition, it can be used by being incorporated in a coating/developing system for an LCD substrate.

Figure 19:
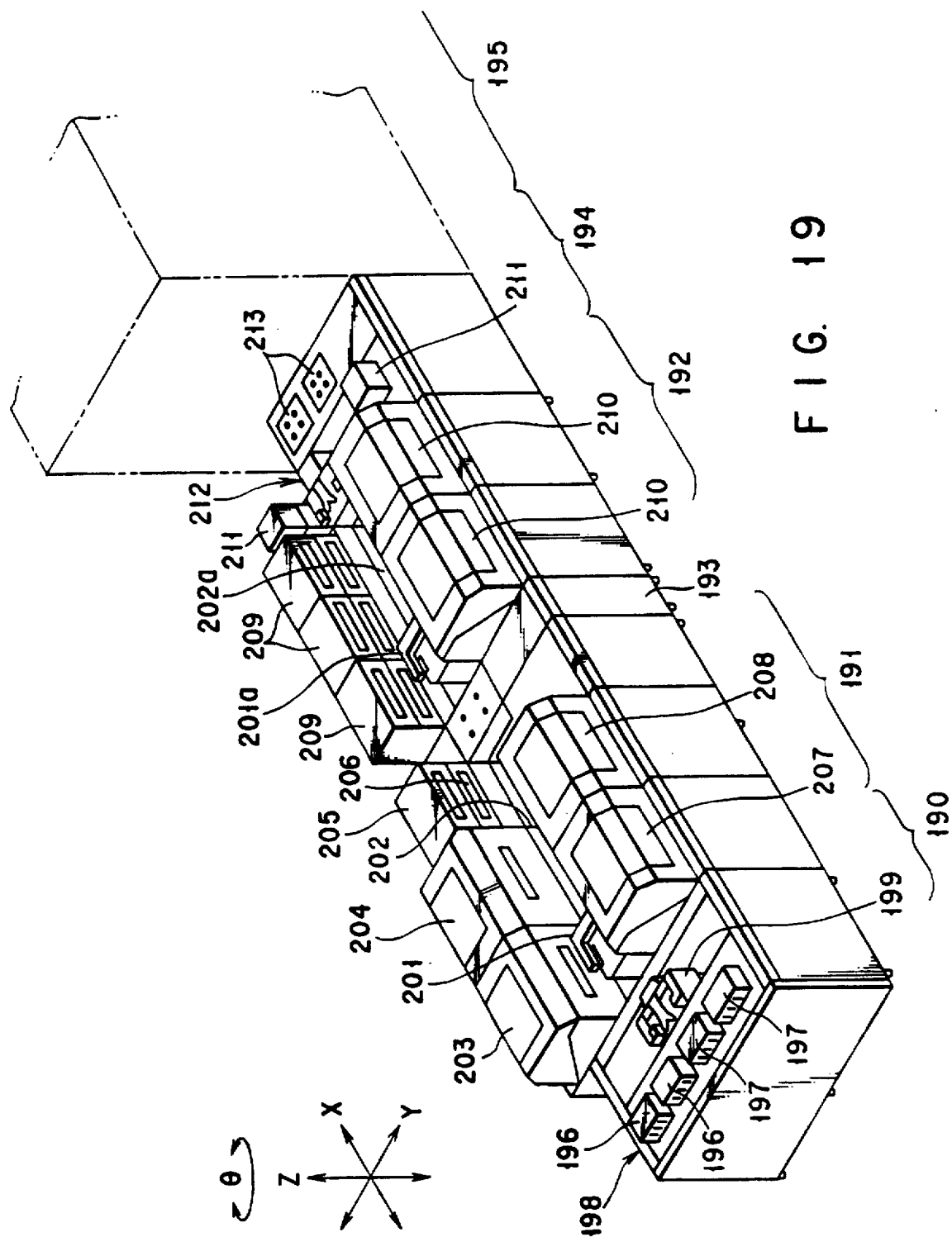
FIG. 19 is a perspective view showing a resist coating/developing system in which the resist processing apparatus used to practice the resist processing method according to the second embodiment of the present invention is incorporated.

As shown in FIG. 19, the coating/developing system is mainly constituted by a loader section 190 in/from which the substrate G is loaded/unloaded, a first processing section 191 for the substrate G, and a second processing section 192 coupled to the first processing section 191 through a relay section 193. An exposure unit 195 for exposing a predetermined fine pattern on a resist film can be coupled to the second processing section 192 through a transfer section 194.

The loader section 190 is constituted by a cassette table 198 on which cassettes 196 for housing the unprocessed substrates G and cassettes 197 for housing the processed substrates G are placed, and a substrate load/unload tweezers mechanism 199 which can move in the horizontal (X and Y) and vertical (Z) directions and rotate (θ) so as to load/unload the substrate between the cassettes 196 and 197 on the cassette table 198.

In the first processing section 191, a brush cleaning unit 203 for cleaning the substrate G by a brush, a jet water cleaning unit 204 for cleaning the substrate G with high-pressure jet water, an adhesion unit 205 for hydrophobically processing the surface of the substrate G, and a cooling unit 206 for cooling the substrate G to a predetermined temperature arranged under the adhesion unit 205 are arranged at one side of a convey path 202 of a convey arm mechanism 201 which can move in the X, Y, and Z directions and rotate (θ). A resist coating unit 207 for coating a resist solution on the surface of the substrate G, and a resist removing unit 208 for removing the resist at the peripheral edge portion of the substrate G are arranged at the other side of the convey path 202.

The second processing section 192 has a convey arm mechanism 201a which can move in the X, Y, and Z directions and rotate (θ), similar to the first processing section 191. Heating units 209 each for heating the substrate G upon coating of the resist solution to perform pre-baking/post-baking are arranged at one side of a convey path 202a of the convey arm mechanism 201a. Developing units 210 as the processing apparatus of the present invention are arranged at the other side of the convey path 202a.

In the transfer section 194, a cassette 211 for temporarily waiting the substrate G, a convey tweezers mechanism 212 for loading/unloading the substrate G in/from the cassette 211, and a transfer stage 213 for the substrate G are provided.

In the coating/developing processing system having the above arrangement, the unprocessed substrate G housed in the cassettes 196 is extracted by the load/unload tweezers mechanism 199 of the loader section 190. The extracted substrate G is transferred to the convey arm mechanism 201 of the first processing section 191, and conveyed into the brush cleaning unit 203. The substrate G cleaned by the brush in the brush cleaning unit 203 is subsequently dried. Note that the substrate G may be cleaned by high-pressure jet water in the jet water cleaning unit 204 depending on application processes.

Thereafter, the substrate G is hydrophobically processed in the adhesion unit 205, and the processed substrate G is cooled in the cooling unit 206. A photoresist film, i.e., a photosensitive film is coated and formed on the cooled substrate G in the resist coating unit 207. After this photoresist is heated in the heating unit 209 to perform a baking process, a predetermined pattern is exposed on the resultant substrate G in the exposure unit 195. The exposed substrate G is conveyed into the developing unit 210 according to the second aspect of the present invention. In this unit, after the substrate G is developed with the developing solution via the above-mentioned processes of the present invention, the developing solution is washed away with the rinse solution to complete the developing process. The processed substrate G on which the developing process is performed is housed in one of the cassettes 197 of the loader section 190, and then unloaded from the cassette 197. The unloaded substrate G is transferred to the next processing step.

This embodiment exemplifies the case in which the resist processing method and the resist processing apparatus of the present invention are applied to the developing process for the LCD substrate. These method and apparatus of the present invention can be applied to a method and apparatus for coating a process solution on a quadrilateral object to be processed except for the LCD substrate, as a matter of course.

As has been described above, the first aspect of the present invention comprises a processing step of supplying a process solution onto an object to be processed to perform a process on the object to be processed, and a cleaning step of supplying a cleaning solution onto the object to be processed to clean the object to be processed. The processing step at least partially overlaps the cleaning step. For this reason, before the process solution is supplied onto the object to be processed to which a circuit pattern is transferred, the cleaning solution is supplied to form a liquid film on the surface of the object to be processed, thereby promoting spread of the process solution. With this operation, the throughput can be increased. By mixing and substituting the process solution and the cleaning solution, swell and shrinkage of the circuit pattern formed on the object to be processed can be relaxed. Therefore, the yield can be increased.

The second aspect of the present invention comprises the steps of positioning a process solution supply means for supplying a process solution above a quadrilateral object to be processed having a pair of opposing edges, moving the process solution supply means toward one edge of the pair of edges of the object to be processed relative to the object to be processed while supplying the process solution onto the object to be processed by the process solution supply means, and moving the process solution supply means from one edge of the object to be processed toward the other edge of the pair of edges of the object to be processed relative to the object to be processed while supplying the process solution onto the object to be processed by the process solution supply means. With this arrangement, the process solution can be assuredly coated on the edge portion of the object to be processed to uniform the coating of the process solution. Therefore, the yield can be increased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means;

moving said process solution supply means from one edge of said object toward the other edge of said pair of edges of the object relative to said object while supplying said process solution onto one major surface of said object by said process solution supply means; and supplying a cleaning water onto the other major surface of said object from its central portion toward the edge.

2. A method according to claim 1, wherein said process solution is uninterruptedly supplied onto one major surface of the object from said process solution supply means.

3. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means;

moving said process solution supply means from one edge of said object toward the other edge of said pair of edges of the object relative to said object while supplying said process solution onto one major surface of said object by said process solution supply means; and;

rotating the object coated with said process solution while changing the rotational direction clockwise and counterclockwise.

4. A method according to claim 3, wherein said process solution is uninterruptedly supplied onto one major surface of the object from said process solution supply means.

5. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means; and moving said process solution supply means from one edge of said object toward the other edge of said pair of edges of the object relative to said object while supplying said process solution onto one major surface of said object by said process solution supply means;

wherein movement of said process solution supply means to reach the edge of said object is detected.

6. A method according to claim 5, wherein movement of said process solution supply means to reach the edge of said object is detected by an optical sensor.

7. A method according to claim 5, wherein said process solution is uninterruptedly supplied onto one major surface of the object from said process solution supply means.

8. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means; and moving said process solution supply means from one edge of said object toward the other edge of said pair of edges of the object relative to said object while supplying said process solution onto one major surface of said object by said process solution supply means;

wherein bubbles generated within said process solution supply means are removed.

9. A method according to claim 8, wherein bubbles generated within said process solution supply means are removed by blowing a compressed air into the process solution supply means.

10. A method according to claim 8, wherein said process solution is uninterruptedly supplied onto one major surface of the object from said process solution supply means.

11. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means; and moving said process solution supply means from one edge of said object toward the other edge of said pair of edges of the object relative to said object while supplying said process solution onto one major surface of said object by said process solution supply means;

wherein generation of a turbulent flow is prevented around said object to be processed.

12. A method according to claim 11, wherein said process solution is uninterruptedly supplied onto one major surface of the object from said process solution supply means.

13. A resist processing method for an object to be processed, comprising the steps of:

positioning process solution supply means for supplying a process solution above a quadrilateral object to be processed having a pair of opposing edges;

moving said process solution supply means towards one edge of said pair of edges of said object relative to said object while supplying said process solution onto said object by said process solution supply means; and moving said process solution supply means from one edge of said object toward the other edge of said pair of edges of the object relative to said object while supplying said process solution onto one major surface of said object by said process solution supply means;

wherein said object to be processed is an LCD substrate.

14. A method according to claim 13, wherein said process solution is uninterruptedly supplied onto one major surface of the object from said process solution supply means.

* * * * *